United States Patent
Yosui (10) Patent No.: US 11,291,109 B2
(45) Date of Patent: Mar. 29, 2022

(54) TRANSMISSION LINE AND MOUNTING STRUCTURE THEREOF

(71) Applicant: Murata Manufacturing Co., Ltd., Nagaokakyo (JP)

(72) Inventor: Kuniaki Yosui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/066,514

(22) Filed: Oct. 9, 2020

(65) Prior Publication Data

US 2021/0029822 A1 Jan. 28, 2021

Related U.S. Application Data

(63) Continuation of application No. PCT/JP2019/017141, filed on Apr. 23, 2019.

(30) Foreign Application Priority Data

May 8, 2018 (JP) .............................. JP2018-089744

(51) Int. Cl.
*H05K 1/02* (2006.01)
*H05K 1/03* (2006.01)
(Continued)

(52) U.S. Cl.
CPC ......... *H05K 1/0253* (2013.01); *H05K 1/0242* (2013.01); *H05K 1/0393* (2013.01);
(Continued)

(58) Field of Classification Search
CPC .......... H05K 2201/09727; H05K 2201/09263; H05K 1/0393; H05K 1/0242; H05K 1/0253
See application file for complete search history.

(56) References Cited

U.S. PATENT DOCUMENTS

2001/0054939 A1* 12/2001 Zhu ...................... H05K 1/0251
                                                                  333/33
2006/0258187 A1* 11/2006 Behziz ................. H05K 1/0251
                                                                  439/77
(Continued)

FOREIGN PATENT DOCUMENTS

JP 2001-308547 A 11/2001
JP 2006-173400 A 6/2006
(Continued)

OTHER PUBLICATIONS

Official Communication issued in International Patent Application No. PCT/JP2019/017141, dated Jul. 23, 2019.

*Primary Examiner* — Hoa C Nguyen
*Assistant Examiner* — Amol H Patel
(74) *Attorney, Agent, or Firm* — Keating & Bennett, LLP (57) ABSTRACT

A transmission line includes connecting portions connected to the outside and a main body located between the connecting portions. Each of the connecting portions includes a terminal electrode connected to an external electrode, a signal conductor, and ground conductors. The main body includes the signal conductor and the ground conductors, and at least one of the plurality of connecting portions includes a first region including the terminal electrode, a second region adjacent to the first region along a signal propagation path, and a third region located between the second region and the main body. The first region, the second region, and the third region provide impedance matching at the connecting portion.

20 Claims, 7 Drawing Sheets

(51) Int. Cl.
*H01P 5/08* (2006.01)
*H05K 1/11* (2006.01)
*H01P 3/08* (2006.01)

(52) U.S. Cl.
CPC .............. *H05K 2201/09263* (2013.01); *H05K 2201/09727* (2013.01)

(56) References Cited

U.S. PATENT DOCUMENTS

2017/0125870 A1* 5/2017 Baba .................... H05K 1/0239
2019/0141831 A1 5/2019 Baba

FOREIGN PATENT DOCUMENTS

| JP | 2008-541484 A | 11/2008 |
| WO | 2018/025697 A1 | 2/2018 |

* cited by examiner

TRANSMISSION LINE AND MOUNTING STRUCTURE THEREOF

CROSS REFERENCE TO RELATED APPLICATIONS

This application claims the benefit of priority to Japanese Patent Application No. 2018-089744 filed on May 8, 2018 and is a Continuation Application of PCT Application No. PCT/JP2019/017141 filed on Apr. 23, 2019. The entire contents of each application are hereby incorporated herein by reference.

BACKGROUND OF THE INVENTION

1. Field of the Invention

The present invention relates to a transmission line for transmitting a signal and a mounting structure for mounting the transmission line on a circuit board or the like.

2. Description of the Related Art

A transmission line constituted of a laminated body having a plurality of insulating base materials laminated has a structure in which an end of a signal conductor of the transmission line is connected to a terminal electrode formed on an upper surface or a lower surface of the laminated body. Therefore, in the transmission line including a plurality of signal conductors, because positions of the plurality of signal conductors in the laminating direction are different, lengths of interlayer connection conductors connected to the respective signal conductors are different, which causes the electrical characteristics of the transmission line for each signal conductor to become uneven.

International Publication No. WO 2018/025697 shows transmission lines in which unevenness of the electrical characteristics of each transmission line is suppressed by forming a conductor pattern for adjusting a path length of a signal conductor at an end of each signal conductor.

In the transmission lines in each of which the terminal electrode is pulled out from the end of the signal conductor of the transmission line as shown in International Publication No. WO 2018/025697, in a structural part from the end of the signal conductor to the terminal electrode, parasitic components such as parasitic capacitance and parasitic inductance which are different from in other structural parts (main transmission line parts) are generated. Therefore, impedance mismatching easily occurs in the structural part from the end of the signal conductor to the terminal electrode. When the impedance mismatching occurs, insertion loss increases, and a problem occurs in a high frequency circuit due to signal reflection.

SUMMARY OF THE INVENTION

Preferred embodiments of the present invention provide transmission lines the each achieve impedance matching in a structural portion from an end of a signal conductor to a terminal electrode, and mounting structures of the transmission lines.

A transmission line as an example of the present disclosure includes a plurality of connecting portions respectively connected to the outside and a main body located between the connecting portions. Each of the connecting portions includes a terminal electrode connected to an external electrode, a signal conductor, and a ground conductor, the main body includes a signal conductor and a ground conductor, and at least one of the plurality of connecting portions includes a first region including the terminal electrode, a second region adjacent to the first region along a signal propagation path, and a third region located between the second region and the main body. The first region includes an inductance component generated in the signal conductor larger than an inductance component generated in the main body, and the second region includes a capacitance component generated between the terminal electrode and the ground conductor larger than a capacitance component generated in the main body, and the third region includes an inductance component generated in the signal conductor larger than the inductance component generated in the main body.

Accordingly, the inductance component of the first region, the capacitance component of the second region, and the inductance component of the third region define an L-C-L circuit. Therefore, a shift in impedance due to the inductance component generated in the first region is corrected by the capacitance component in the second region and the inductance component in the third region, and the impedance is able to be matched with the characteristic impedance of the main body of the transmission line. Therefore, increase in reflection and insertion loss due to impedance discontinuity is significantly reduced or prevented.

According to the preferred embodiments of the present invention, transmission lines with impedance matching at the connecting portion connected to the outside are able to be provided, and mounting structures of the transmission lines are also able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, a plurality of preferred embodiments of the present invention are shown with some specific examples with reference to the drawings. In each figure, the same or similar portions are designated by the same reference numerals. Although the preferred embodiments are shown separately for convenience in consideration of the explanation of main points or the ease of understanding, partial replacement or combination of the components, features, and elements shown in different preferred embodiments is possible. In the second and subsequent preferred embodiments, description of matters common to the first preferred embodiment is omitted, and only different points are described. In particular, the same or similar operation and effects of the same component, feature, or element is not successively described for each preferred embodiment.

Figure 1A:
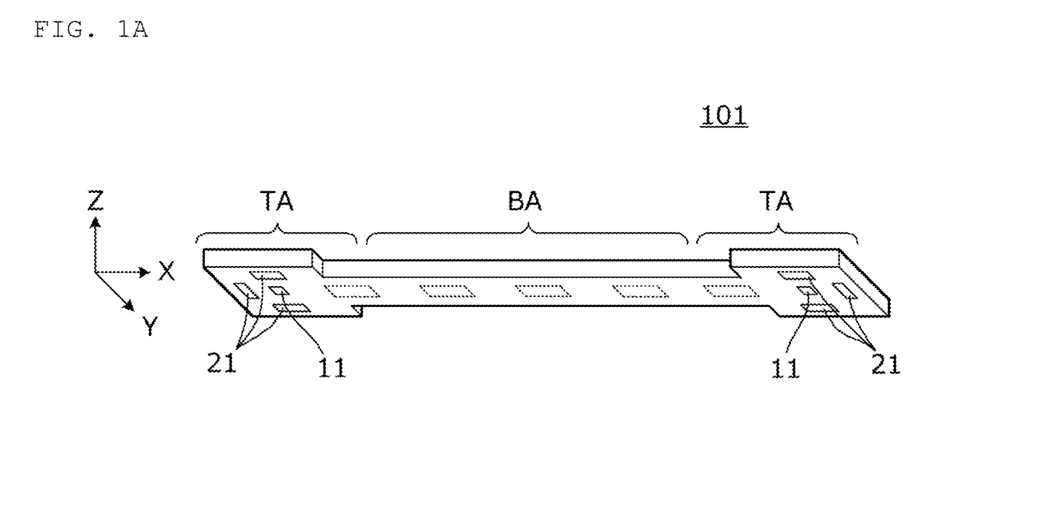
FIG. 1A is a perspective view of a transmission line according to a first preferred embodiment of the present invention.
Figure 1B:
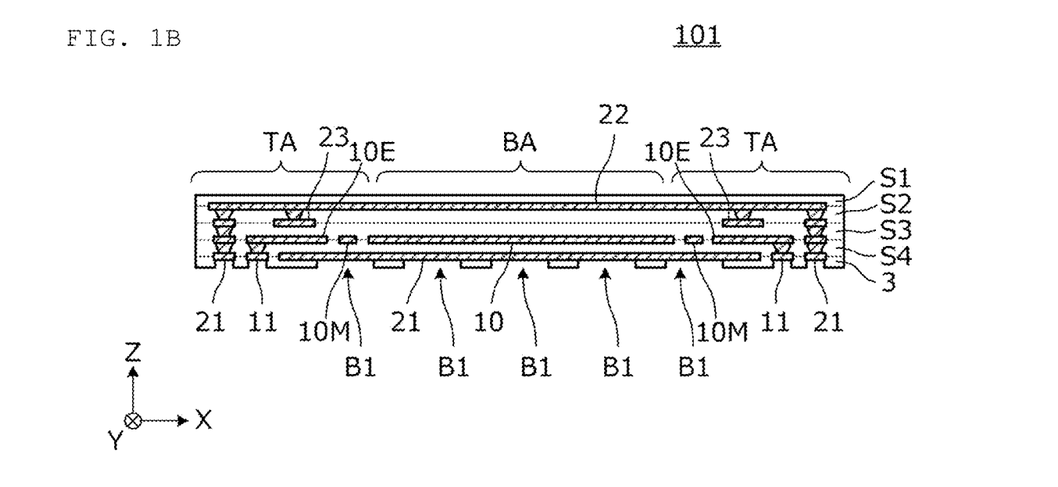
FIG. 1B is a sectional view of the transmission line.

FIG. 1A is a perspective view of a transmission line 101 according to a first preferred embodiment, and FIG. 1B is a sectional view of the transmission line 101.

The transmission line 101 is a laminated body including insulating base materials S1-S4 on which predetermined conductor patterns are provided and a cover film 3.

The transmission line 101 includes two connecting portions TA that are respectively connected to the outside and a main body BA located between the two connecting portions TA-TA. Each connecting portion TA has a terminal electrode 11 connected to an external electrode described later, a signal conductor 10, and ground conductors 21, 22. The main body BA has the signal conductor 10 and the ground conductors 21, 22. The cover film 3 has openings B1 for partially exposing the ground conductor 21.

Figure 2:
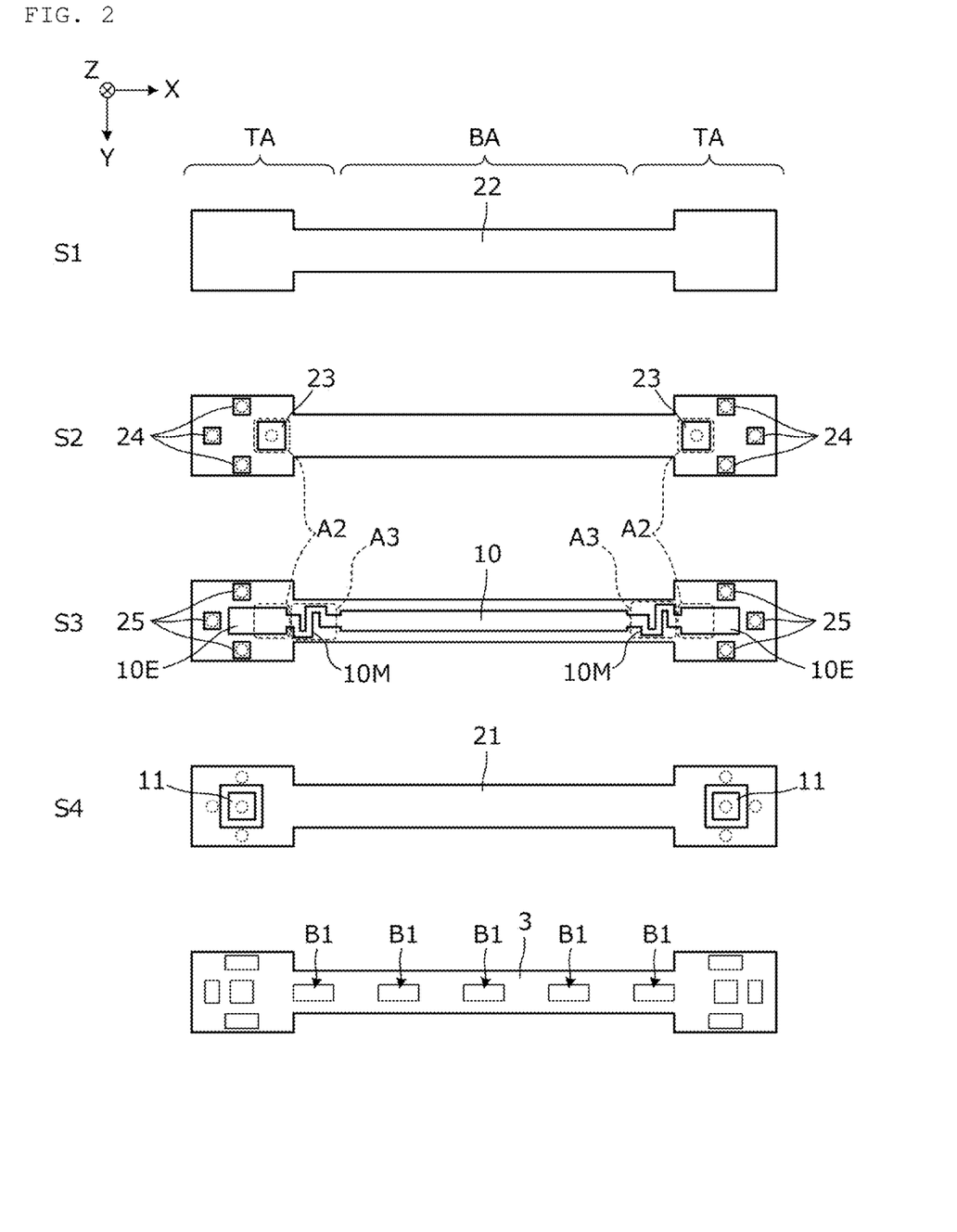
FIG. 2 is a bottom view of each layer of a laminated body defining the transmission line.
Figure 3:
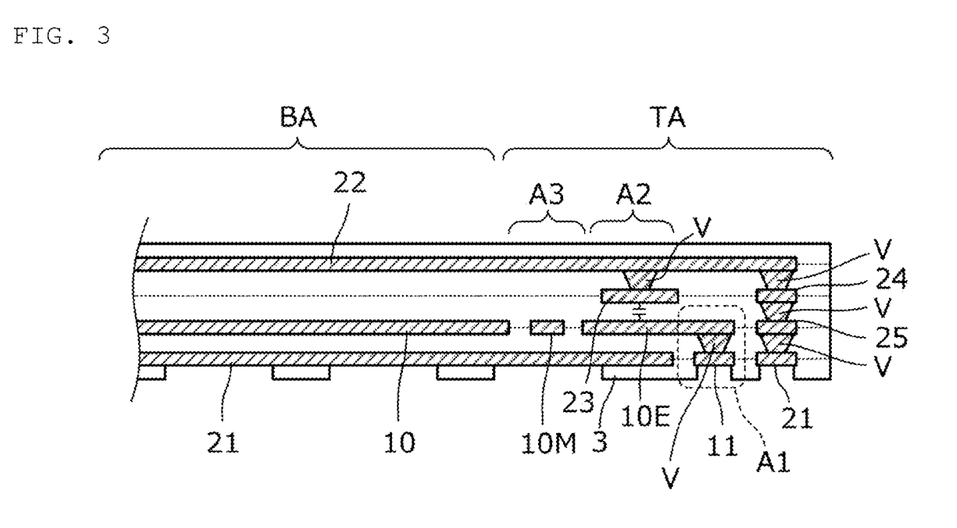
FIG. 3 is an enlarged sectional view of a portion of a connecting portion of the transmission line.

FIG. 2 is a bottom view of each layer of the laminated body defining the transmission line 101. In a direction shown in FIGS. 1A and 1B, the insulating base materials S1-S4 have predetermined conductor patterns provided on lower surfaces thereof. Further, FIG. 3 is an enlarged sectional view of a portion of the connecting portion TA of the transmission line 101. In FIG. 1B and FIG. 3, hatching at portions of insulating layers is omitted to clarify the diagrams. In each of the preferred embodiments described below, hatching of the portions of the insulator layers is omitted in the sectional views.

The insulating base material S1 includes, on the entire surface thereof, the ground conductor 22.

The insulating base material S2 includes electrodes 24 each electrically connected to the ground conductor 22 via an interlayer connection conductor (via conductor) V, and auxiliary ground conductors 23 each electrically connected to the ground conductor 22 via an interlayer connection conductor (via conductor) V.

The insulating base material S3 includes the signal conductor 10. Further, the insulating base material S3 includes electrodes 25 each connected to the electrode 24 via an interlayer connection conductor (via conductor) V.

Between an end 10E of the signal conductor 10 and the signal conductor 10 in the main body BA, a meander line-shaped inductor portion 10M having a line width thinner than that of the signal conductor 10 in the main body BA is provided. A region A3 having the inductor portion 10M provided corresponds to a "third region."

The insulating base material S4 includes the terminal electrodes 11 and the ground conductor 21. The cover film 3 includes the openings that expose the terminal electrodes 11 and predetermined portions of the ground conductor 21.

The insulating base materials S1-S4 are flexible resin sheets, for example, liquid crystal polymer (LCP) or polyether ether ether ketone (PEEK). The electrodes (conductors) are each formed by sticking a copper foil on the insulating base material and patterning the copper foil by photolithography. The cover film 3 is, for example, a polyimide film. Note that a resist film may be formed by printing instead of pasting the cover film as described above.

In the main body BA, the signal conductor 10 and the ground conductors 21, 22, and the insulating base material located between the ground conductors 21, 22 and the signal conductor 10 define a strip line. Similarly, in the connecting portion TA, the signal conductor 10 and the ground conductors 21, 22, and the insulating base material located between the ground conductors 21, 22 and the signal conductor 10 define a strip line.

As shown in FIG. 2 and FIG. 3, a distance between the end 10E of the signal conductor 10 and the auxiliary ground conductor 23 is closer than a distance between the signal conductor 10 in the main body BA and the ground conductor 22. Therefore, a capacitance component generated between the end 10E of the signal conductor 10 and the auxiliary ground conductor 23 is larger than a capacitance component generated in the main body BA. A region A2 in which this large capacitance component is generated corresponds to a "second region."

Further, in FIG. 3, an inductance component is generated from a region where the end 10E of the signal conductor 10 and the auxiliary ground conductor 23 face each other to a region of the terminal electrode 11. A region A1 in which this inductance component is generated corresponds to a "first region."

As described above, the connecting portion TA includes the first region A1 including the terminal electrode 11, the second region A2 adjacent to the first region A1 along the signal propagation path, and the third region A3 located between the second region A2 and the main body BA. The direction "along the signal propagation path" is a propagation direction of a signal propagating in the strip line including the portions 10M, 10E of the signal conductor and the conductors 21, 22, 23 at the ground potential, and is a direction in which the conductors 21, 22, 23 and other components and/or elements at the ground potential are viewed in the vertical direction.

The main body BA defines a normal strip line, and therefore, is a distributed constant circuit. Although the connecting portion TA also defines a strip line, in this connecting portion TA, the portions 10E, 10M of the signal conductors and the conductors 21, 22, 23 at the ground potential are provided as a lumped constant circuit at portions having a large inductance component and a large capacitance component.

The inductance component generated in the first region A1 is larger than the inductance component generated in the main body BA. Further, the capacitance component generated in the second region A2 is larger than the capacitance component generated in the main body BA. Still further, the inductance component generated in the third region A3 is larger than the inductance component generated in the main body BA.

Figure 4:
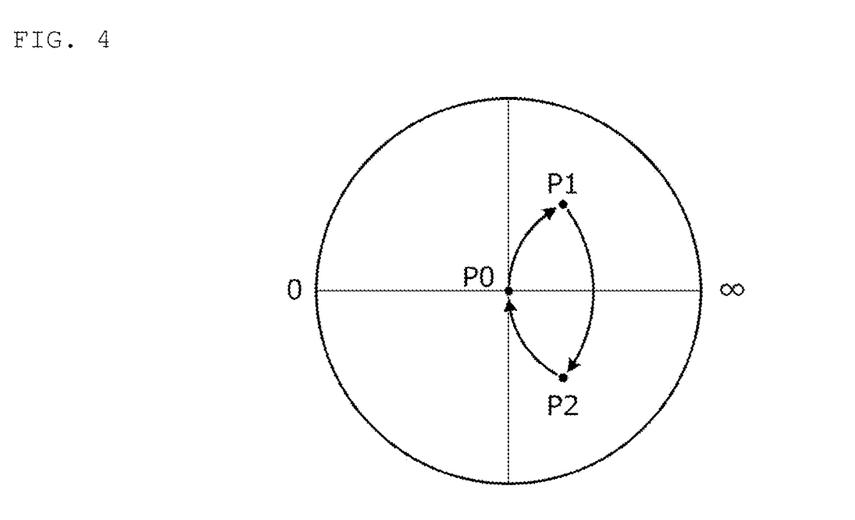
FIG. 4 is a Smith chart showing an action of a first region, a second region, and a third region provided in the connecting portion.

FIG. 4 is a Smith chart showing the action of the first region A1, the second region A2, and the third region A3 provided in the connecting portion TA. In FIG. 4, each point represents the impedance in each portion of the transmission line 101, and each curve represents a process of change in impedance by the first region A1, the second region A2, and the third region A3 due to insertion of reactance.

Due to the action of the inductance component of the first region A1 shown in FIG. 3, the impedance seen from the front side of the first region A1 to the first region A1 side is displaced from a reference point P0 to P1 along a constant resistance circle. Further, due to the action of the capacitance component of the second region A2, the impedance seen from the front side of the second region A2 to the second region A2 side is displaced to P2 along a constant conductance circle. Then, due to the action of the inductance component of the third region A3, the impedance seen from the front side of the third region A3 to the third region A3 side is displaced to P0 along the constant resistance circle. That is, the impedance matches with a reference impedance (about 50Ω).

The example shown in FIG. 4 shows a combination of a certain inductance value, a certain capacitance value, and a certain inductance value, but it is clear that this is an example.

Further, in FIG. 3, one connecting portion TA among the two connecting portions TA is shown, however, in the one connecting portion TA and the other connecting portion TA of the transmission line 101, the inductance component of the first region A1, the capacitance component of the second region A2, and the inductance component of the third region A3 are preferably set, respectively, to the same or substantially the same value, because a wider frequency band is able to be supported, for example.

Because the width of the signal conductor 10 of the main body BA is constant or substantially constant and the distance between the signal conductor 10 and each of the ground conductors 21, 22 is also constant or substantially constant, the change in the characteristic impedance of the main body BA is small and the transmission loss is small.

In the example shown in FIG. 2, although the signal conductor 10 has a step shape at a boundary between a portion with a thin line width defining the third region A3 and the main body BA (portion with a thick line width), the boundary where the line width of the signal conductor 10 changes is preferably tapered or the like, for example, to reduce the change in line width along the signal propagation direction. This is because the loss generated at the portion of the signal conductor 10 where the line width changes is significantly reduced or prevented.

A second preferred embodiment shows an example of a mounting structure of a transmission line.

Figure 5A:
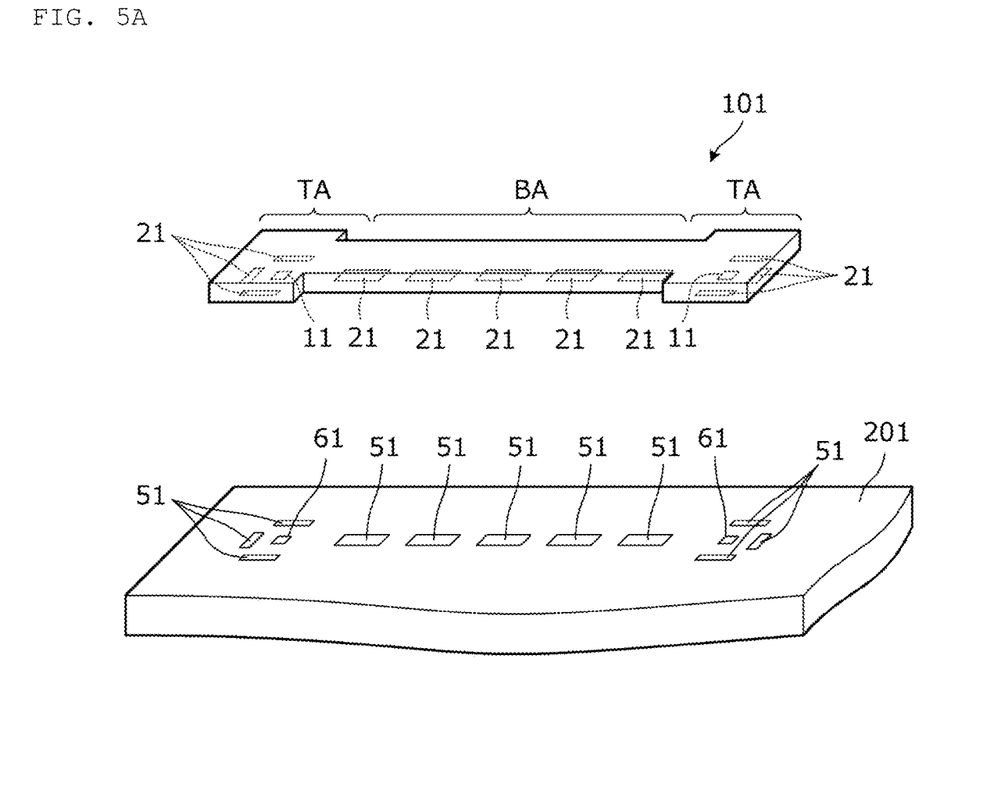
FIGS. 5A and 5B are perspective views showing a structure of an electronic device according to a second preferred embodiment of the present invention.
Figure 5B:
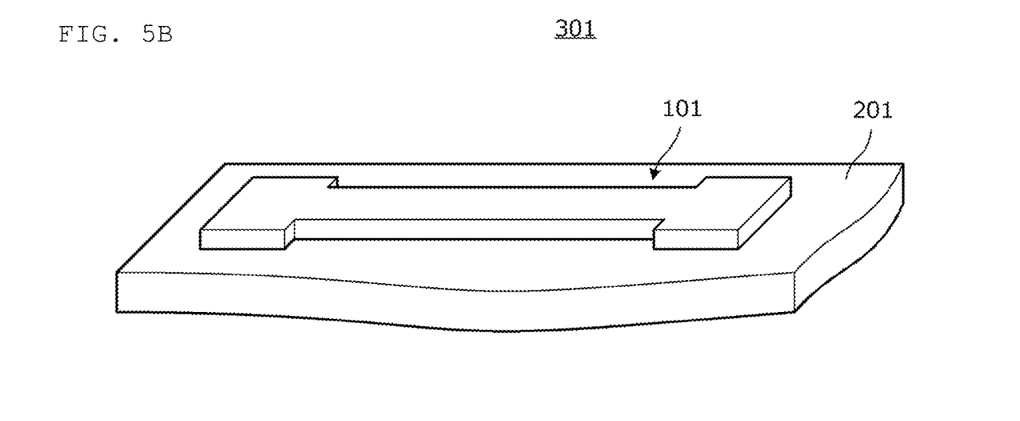

FIGS. 5A and 5B are perspective views showing a structure of an electronic device 301 according to the second preferred embodiment. FIG. 5A is an exploded perspective view of the main portion of the electronic device 301, and FIG. 5B is a perspective view of the main portion of the electronic device 301.

As shown in FIG. 5B, the electronic device 301 of this preferred embodiment includes a substrate 201 and a transmission line 101 mounted on the substrate 201. Although components and/or elements other than the transmission line 101 are also mounted on the substrate 201, the components and/or elements do not appear in FIGS. 5A and 5B.

The transmission line 101 shown in FIGS. 5A and 5B is as shown in the first preferred embodiment.

The ground conductor 21 is exposed from the cover film 3 on the lower surface (mounting surface) of the transmission line 101.

A resist film is provided on the mounting surface of the substrate 201. The substrate 201 includes substrate-side connection electrodes 61 to which the terminal electrodes 11 of the transmission line 101 are connected and which are exposed from the resist film. Further, a substrate-side ground conductor 51 is exposed on the mounting surface of the substrate 201.

By surface-mounting the transmission line 101 on the substrate 201, the terminal electrodes 11 of the transmission line 101 are connected to the substrate-side connection electrodes 61, and the ground conductor 21 of the transmission line 101 is connected to the substrate-side ground conductor 51. These connections are provided by soldering, for example.

Figure 6:
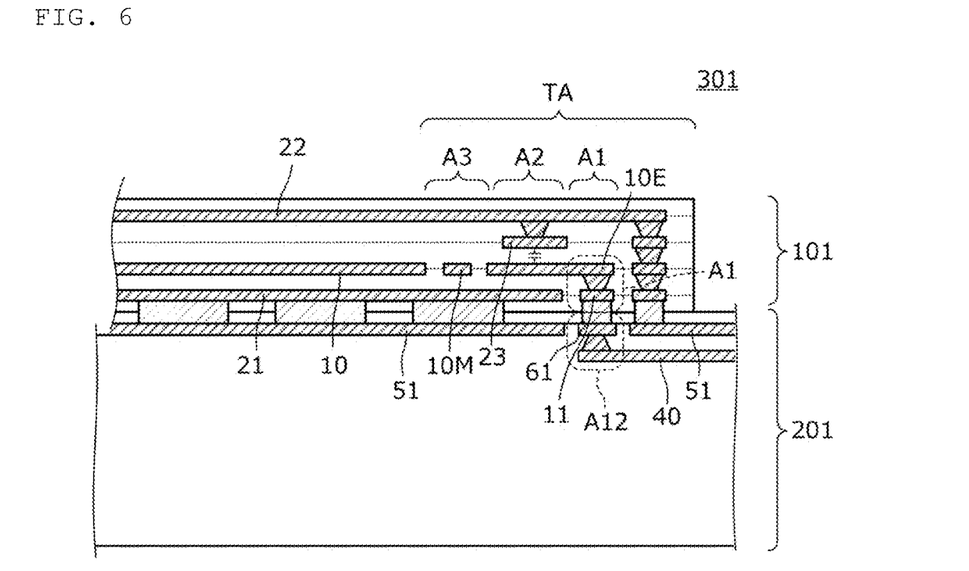
FIG. 6 is a partially enlarged sectional view of a transmission line mounting structure in which the transmission line is mounted on a substrate.

FIG. 6 is a partially enlarged sectional view of a mounting structure of a transmission line in which the transmission line 101 is mounted on the substrate 201. In FIG. 6, the inductance component is also generated in a region A12 from an end of a signal conductor 40 on the substrate 201 side to the terminal electrode 11. The first region A1 of the transmission line 101 alone is as shown in FIG. 3. That is, by mounting the transmission line 101 on the substrate 201, the inductance component added to the first region A1 increases. An impedance matching circuit defined by the first region A1, the second region A2, and the third region A3 provided at the connecting portion of the transmission line 101 may be determined according to an increase in the inductance component added to the first region A1 in the mounted state on the substrate. Accordingly, the impedance matching of the connecting portion is performed with higher accuracy in a state in which the transmission line 101 is mounted on the substrate 201.

A third preferred embodiment shows an example of a transmission line with connector, and a mounting structure thereof.

Figure 7:
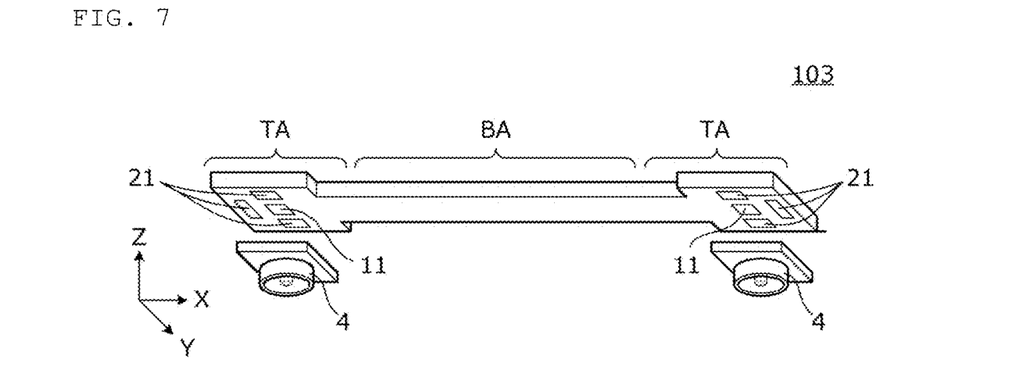
FIG. 7 is an exploded perspective view of a transmission line according to a third preferred embodiment of the present invention.
Figure 8:
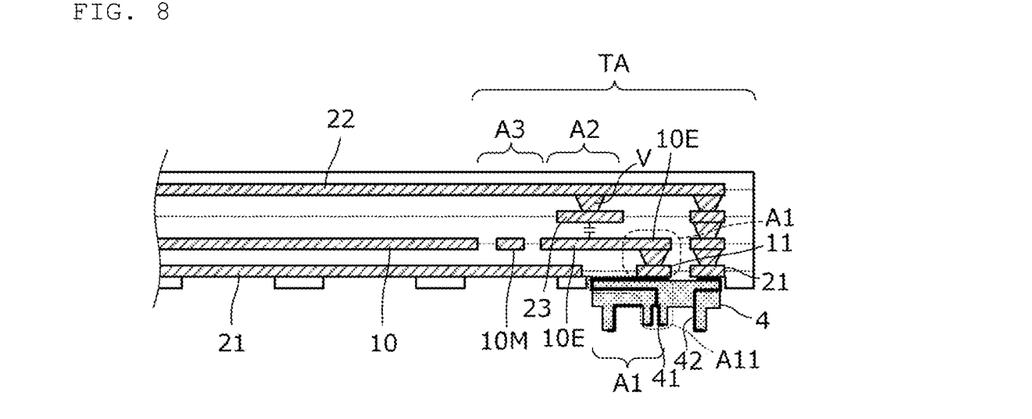
FIG. 8 is an enlarged sectional view of a portion of a connecting portion of the transmission line.

FIG. 7 is an exploded perspective view of a transmission line 103 according to the third preferred embodiment. FIG. 8 is an enlarged sectional view of a portion of a connecting portion TA of the transmission line 103. This transmission line 103 includes two coaxial connectors 4. A basic structure of the transmission line before the coaxial connectors 4 are attached is the same as or similar to the basic structure of the transmission line 101 shown in FIG. 1A. A center conductor 41 of each of the coaxial connectors 4 is connected to the terminal electrode 11, and an outer conductor 42 of each of the coaxial connectors 4 is connected to the ground conductor 21.

In this way, when the connector 4 is provided, the inductance component is generated in a region A11 where a path between the center conductor 41 of the connector 4 and the terminal electrode 11 is provided, and this inductance component is added to the first region A1 of the transmission line. Even in this case, the impedance matching circuit including the first region A1, the second region A2, and the third region A3 provided at the connecting portion of the transmission line 103 may be determined according to the inductance component added to the first region A1 by attaching the connector 4. Accordingly, the impedance matching of the connecting portion is able to be performed with higher accuracy in the state in which the connector 4 is attached.

Figure 9A:
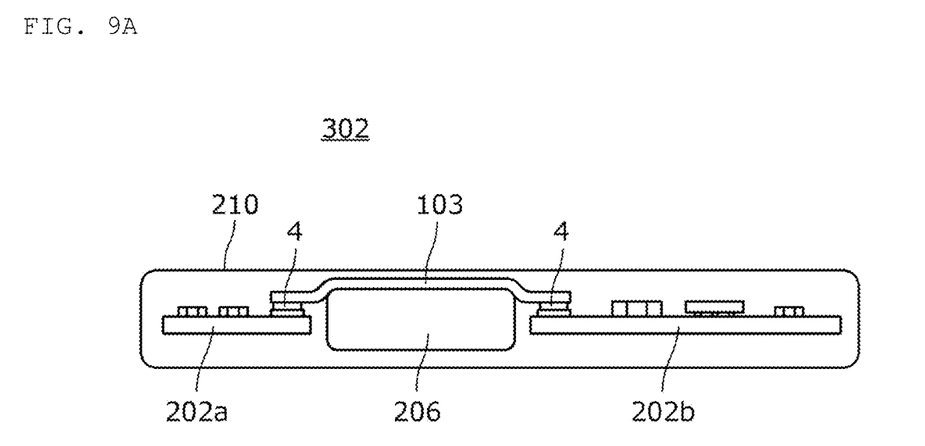
FIG. 9A is a sectional view of a portable electronic device showing a mounted state of the transmission line with connector.
Figure 9B:
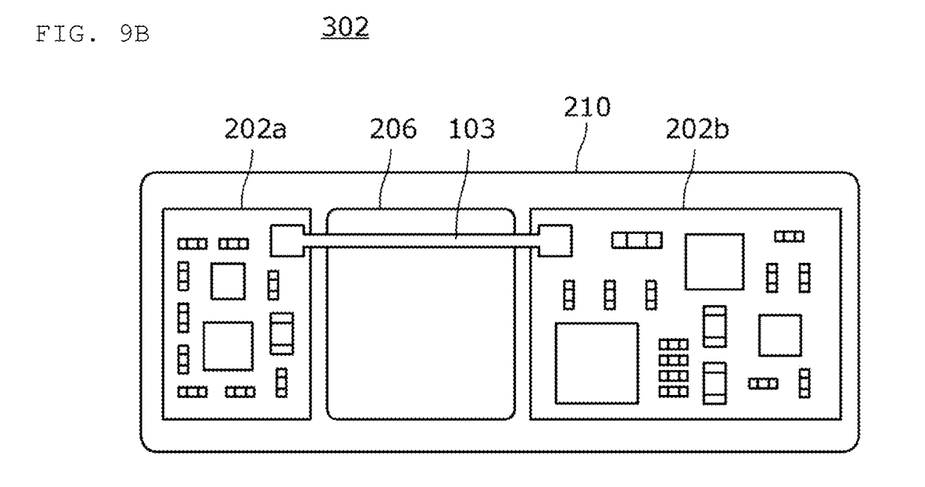
FIG. 9B is a plan view of the inside of a housing of the portable electronic device.

FIG. 9A is a sectional view of a portable electronic device showing a mounted state of the transmission line 103 with connector, and FIG. 9B is a plan view of the inside of a housing of the portable electronic device.

A portable electronic device 302 includes a thin housing 210. In the housing 210, circuit boards 202a, 202b, a battery pack 206, and other components and/or elements are provided. On the surfaces of the circuit boards 202a, 202b, chip components are mounted. The circuit boards 202a, 202b and the battery pack 206 are installed in the housing 210, and the battery pack 206 is located between the circuit boards 202a, 202b in plan view of the housing 210. Because the housing 210 is thin, a distance between the battery pack 206 and the housing 210 in the thickness direction of the housing 210 is extremely narrow. Therefore, a normal coaxial cable is not able to be provided between the battery pack 206 and the housing 210.

Because the transmission line 103 of the present preferred embodiment has flexibility, the transmission line 103 is able to be bent along a gap. By locating the transmission line 103 with the thickness direction thereof matching the thickness direction of the housing 210, the transmission line 103 is able to be passed between the battery pack 206 and the housing 210. Accordingly, the circuit boards 202a, 202b that are spaced apart from each other with the battery pack 206 located in the middle are able to be connected to each other by the transmission line 103.

Because the transmission line of the present preferred embodiment with the portion of the impedance matching circuit that includes the conductor patterns only, the process is able to be simplified. Also, the resistance to bending stress is high. That is, unlike the case in which the chip components for impedance matching is mounted on the transmission line, a fault does not occur in which the chip components are subjected to bending stress and falls off as the transmission line is bent.

The fourth preferred embodiment shows a transmission line having a structure of the third region different from that of the transmission line shown in the first preferred embodiment.

Figure 10:
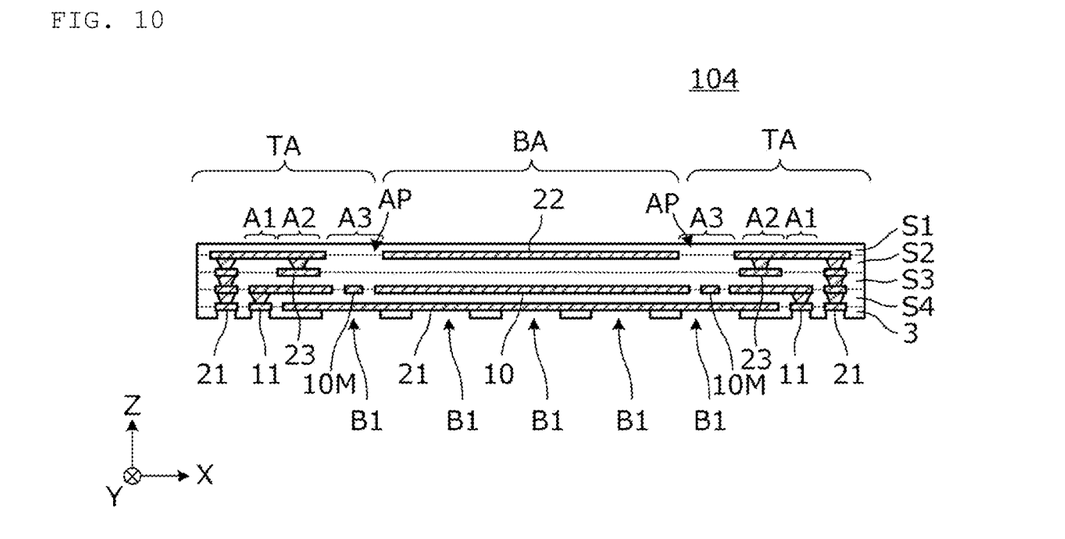
FIG. 10 is a sectional view of a transmission line according to a fourth preferred embodiment of the present invention.

FIG. 10 is a sectional view of a transmission line 104 according to the fourth preferred embodiment. The structure of the third region A3 is different from that of the transmission line 101 shown in FIG. 1B and FIG. 3. In the transmission line 104 of the present preferred embodiment, an opening AP is formed in the ground conductor 22 at a position facing the inductor portion 10M. With this structure, the capacitance component generated between the inductor portion 10M and the ground conductor 22 is significantly reduced, and the inductance component is able to be significantly increased. Therefore, the line width of the signal conductor 10 at the inductor portion 10M is able to be thicker and the line length is able to be shorter than in the examples shown in FIG. 1B and FIG. 2. Accordingly, the conductor loss in the inductor portion 10M is able to be reduced.

As described above, the third region A3 having a predetermined inductance component may be provided by significantly reducing the capacitance component generated between the inductor portion and the ground conductor.

Note that, in FIG. 10, an example is shown in which the inductor portion 10M having a thin line width and provided in a meander line shape is shown, however, if a predetermined inductance component is able to be provided by forming the opening AP in the ground conductor 22, the signal conductor 10 in the third region A3 may be linear. Further, the line width may be the same or substantially the same as the line width of the signal conductor 10 in the main body BA. According to this structure, because the line width of the signal conductor 10 is constant or substantially constant, there is no loss occurring at the portion where the line width changes, and the transmission loss of the entire line is small.

In addition, in some of the preferred embodiments described above, the transmission line including the single signal conductor 10 is illustrated, but a transmission line including a plurality of signal conductors is able to be similarly provided. Further, the plurality of signal conductors may be provided in the same layer or may be provided in different layers.

Further, in some of the preferred embodiments described above, an example is shown in which the end 10E of the signal conductor 10 and the auxiliary ground conductor 23 face each other in the laminating direction of the insulating base materials S1-S4, and the capacitance is generated at this facing portion, but the facing direction is not limited to this. A ground conductor pattern may be provided on the side of the end 10E of the signal conductor 10 in a direction along the surface of the insulating base material, and the capacitance may be generated between the end 10E of the signal conductor 10 and the ground conductor pattern.

Finally, the description of the above preferred embodiments is illustrative in all aspects and is not restrictive. Modifications and changes may be implemented by those skilled in the art as appropriate.

For example, the connecting portions are not limited to one pair, and may be a plurality of pairs. Moreover, the preferred embodiments may be similarly applied to a structure in which a signal conductor is branched between a plurality of connecting portions and one connecting portion.

Further, for example, only one or some of the plurality of connecting portions TA may have the structure of the connecting portion TA of the transmission line shown in each preferred embodiment.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transmission line comprising:
a plurality of connecting portions respectively connected to an outside; and
a main body located between the plurality of connecting portions, wherein
each of the plurality of connecting portions includes a terminal electrode connected to an external electrode, a signal conductor, and a ground conductor;
the main body includes a signal conductor and a ground conductor;
at least one of the plurality of connecting portions includes a first region including the terminal electrode, a second region adjacent to the first region along a signal propagation path, and a third region located between the second region and the main body;
the first region includes an inductance component generated in the signal conductor larger than an inductance component generated in the main body, and an interlayer connection conductor that connects the terminal electrode with the signal conductor;
the second region includes an auxiliary ground conductor and a capacitance component generated between the terminal electrode and the ground conductor larger than a capacitance component generated in the main body, and the second region does not include the interlayer connection conductor;
the auxiliary ground conductor does not overlap with the interlayer connection conductor;

a distance between the signal conductor in the main body and the ground conductor is larger than a distance between the signal conductor in the second region and the auxiliary ground conductor; and the third region includes the inductance component generated in the signal conductor larger than the inductance component generated in the main body.

2. The transmission line according to claim 1, wherein all of the plurality of connecting portions include the first region, the second region, and the third region.

3. The transmission line according to claim 1, wherein the plurality of connecting portions and the main body include an insulating base material that defines a multilayer substrate and a conductor pattern.

4. The transmission line according to claim 3, wherein the multilayer substrate includes an insulating layer; and
at least one surface of the insulating layer is entirely covered by the ground conductor.

5. The transmission line according to claim 3, wherein the ground conductor and the signal conductor are provided on different layers of the multilayer substrate.

6. The transmission line according to claim 3, wherein the insulating base material includes at least one flexible resin sheet.

7. The transmission line according to claim 1, wherein the signal conductor has a line width in the third region thinner than a line width of the signal conductor in the main body.

8. The transmission line according to claim 1, further comprising a connector that is electrically connected to the terminal electrode and the ground conductor, respectively, and is connected to the external electrode.

9. A mounting structure of a transmission line comprising:
the transmission line according to claim 1; and
a circuit board on which the transmission line is mounted; wherein
the terminal electrode of the transmission line is connected to an electrode provided on a surface of the circuit board.

10. The transmission line according to claim 1, wherein the main body is covered by a cover film; and
the cover film includes at least one opening that at least partially exposes the ground conductor.

11. The transmission line according to claim 1, wherein an insulating base material is provided between the signal conductor and the ground conductor.

12. The transmission line according to claim 1, wherein an insulating base material is provided between the signal conductor and the auxiliary ground conductor.

13. A transmission line comprising:
a plurality of connecting portions respectively connected to an outside; and
a main body located between the plurality of connecting portions, wherein
each of the plurality of connecting portions includes a terminal electrode connected to an external electrode, a signal conductor, and a ground conductor;
the main body includes a signal conductor and a ground conductor;
at least one of the plurality of connecting portions includes a first region including the terminal electrode, a second region adjacent to the first region along a signal propagation path, and a third region located between the second region and the main body;
the first region includes an inductance component generated in the signal conductor larger than an inductance component generated in the main body;
the second region includes a capacitance component generated between the terminal electrode and the ground conductor larger than a capacitance component generated in the main body;
the third region includes the inductance component generated in the signal conductor larger than the inductance component generated in the main body; and
the third region includes a signal conductor with a meander line shape.

14. The transmission line according to claim 13, wherein the signal conductor has a line width in the third region thinner than a line width of the signal conductor in the main body.

15. A mounting structure of a transmission line comprising:
the transmission line according to claim 13; and
a circuit board on which the transmission line is mounted; wherein
the terminal electrode of the transmission line is connected to an electrode provided on a surface of the circuit board.

16. The transmission line according to claim 13, wherein the main body is covered by a cover film; and
the cover film includes at least one opening that at least partially exposes the ground conductor.

17. A transmission line comprising:
a plurality of connecting portions respectively connected to an outside; and
a main body located between the plurality of connecting portions, wherein
each of the plurality of connecting portions includes a terminal electrode connected to an external electrode, a signal conductor, and a ground conductor;
the main body includes a signal conductor and a ground conductor;
at least one of the plurality of connecting portions includes a first region including the terminal electrode, a second region adjacent to the first region along a signal propagation path, and a third region located between the second region and the main body;
the first region includes an inductance component generated in the signal conductor larger than an inductance component generated in the main body;
the second region includes a capacitance component generated between the terminal electrode and the ground conductor larger than a capacitance component generated in the main body;
the third region includes the inductance component generated in the signal conductor larger than the inductance component generated in the main body; and
the ground conductor overlaps with the signal conductor in the second region, and the third region includes an opening located at a position facing the signal conductor.

18. The transmission line according to claim 17, wherein the signal conductor has a line width in the third region thinner than a line width of the signal conductor in the main body.

19. A mounting structure of a transmission line comprising:
the transmission line according to claim 17; and
a circuit board on which the transmission line is mounted; wherein
the terminal electrode of the transmission line is connected to an electrode provided on a surface of the circuit board.

20. The transmission line according to claim 17, wherein
the main body is covered by a cover film; and
the cover film includes at least one opening that at least partially exposes the ground conductor.

\* \* \* \* \*